US006803520B1

(12) United States Patent
Musk

(10) Patent No.: US 6,803,520 B1
(45) Date of Patent: Oct. 12, 2004

(54) HIGH SPEED TO-PACKAGE EXTERNAL INTERFACE

(75) Inventor: Robert William Musk, Kingsbridge (GB)

(73) Assignee: Bookham Technology PLC, Abingdon (GB)

( * ) Notice: Subject to any disclaimer, the term of this patent is extended or adjusted under 35 U.S.C. 154(b) by 0 days.

(21) Appl. No.: 10/423,182

(22) Filed: Apr. 25, 2003

Related U.S. Application Data

(60) Provisional application No. 60/377,736, filed on May 3, 2002.

(51) Int. Cl.[7] ................................................ H01L 23/02
(52) U.S. Cl. ...................................... 174/52.5; 257/680
(58) Field of Search ............................... 174/52.3, 52.4, 174/52.5; 257/680

(56) References Cited

U.S. PATENT DOCUMENTS

| | | | | |
|---|---|---|---|---|
| 4,901,135 A | * | 2/1990 | Costigan | ..................... 257/710 |
| 6,091,022 A | * | 7/2000 | Bodin | ........................ 174/52.5 |
| 6,229,088 B1 | * | 5/2001 | Launtz | .................... 174/50.51 |

* cited by examiner

*Primary Examiner*—Hung V. Ngo
(74) *Attorney, Agent, or Firm*—Parsons & Goltry; Robert A. Parsons; Michael W. Goltry

(57) ABSTRACT

An optoelectronic package includes a supporting structure with a surface, an opposed surface, and at least one side, at least one conductive interconnect extending through the supporting structure from the surface to the opposed surface of the supporting structure, wherein the at least one conductive interconnect is substantially flush with the opposed surface of the supporting structure.

15 Claims, 1 Drawing Sheet

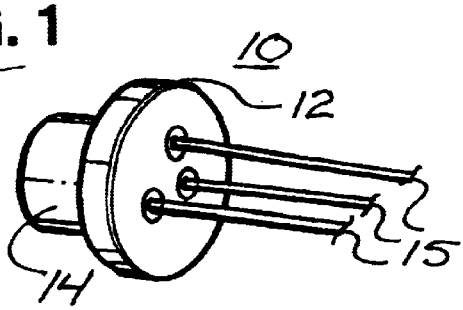
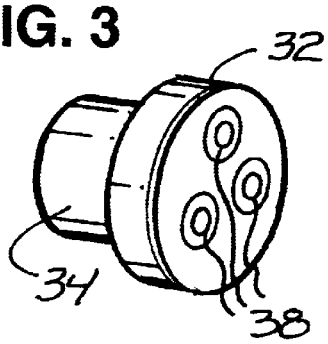
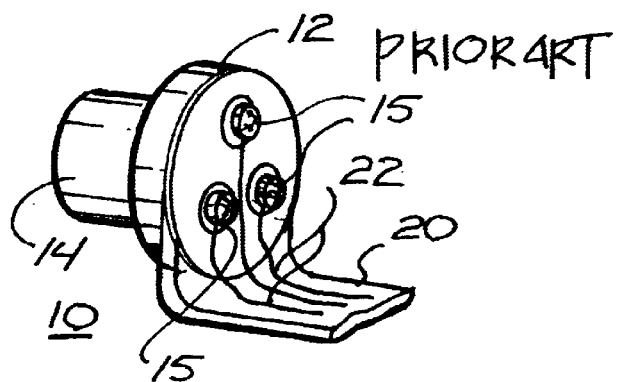
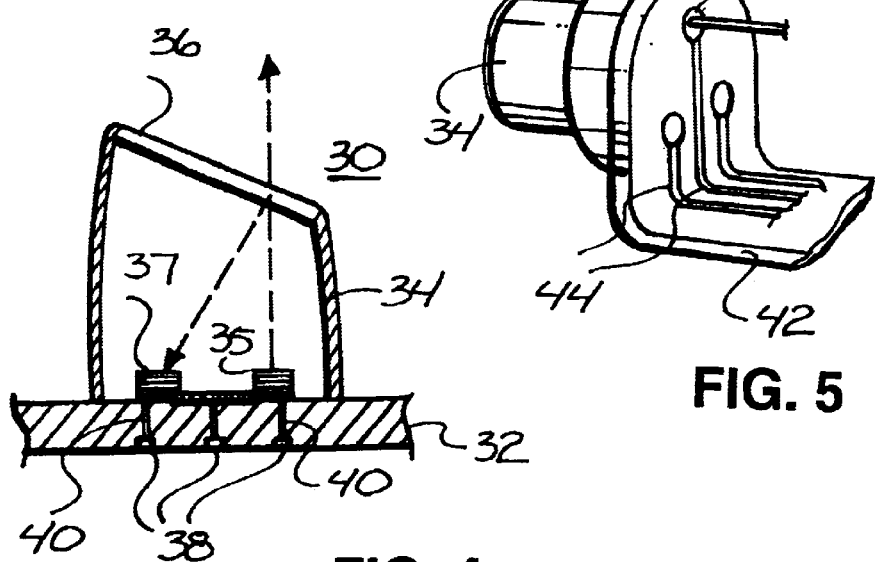

HIGH SPEED TO-PACKAGE EXTERNAL INTERFACE

CROSS-REFERENCE TO RELATED APPLICATION

This application claims the benefit of U.S. Provisional Patent Application No. 60/377,736, filed 03 May 2002.

FIELD OF THE INVENTION

This invention relates to TO-type packages and more particularly to external interfaces for TO-type packages that improve the speed of signals to and from the packages.

BACKGROUND OF THE INVENTION

At the present time, the major electrical-to-optical packages utilized in the communications industry include semiconductor lasers, which may be vertical cavity surface emitting lasers (VCSELs) or edge emitting lasers. Further, these lasers are generally mounted in a sealed container, referred to in the industry as a TO-can or a TO-type package.

To provide connections to components (e.g. a VCSEL an/or a semiconductor light sensing diode) leads are provide that extend outwardly through the bottom of the TO-can. Several problems arise as a result of these leads. First, the leads must be kept straight throughout processing, shipping, storing, subsequent assembly, and other processing steps. Second, the leads must be attached by means of some external structure (e.g., a printed circuit board or flex leads) to drivers and other external circuitry. The leads generate stray capacitive and inductive circuits that produce RF losses that greatly reduce the frequency of operation (speed of the package).

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 1 is an isometric view of a prior art TO-type package;

FIG. 2 is an isometric view of the TO-package of FIG. 1 illustrating a typical external connection;

FIG. 3 is an isometric view of a TO-package in accordance with the present invention;

FIG. 4 is a sectional view illustrating some possible internal components and construction of the TO-package of FIG. 3, in accordance with the present invention; and FIG. 5 is an isometric view illustrating one external connection of the TO-package of FIG. 3.

DETAILED DESCRIPTION OF THE DRAWINGS

Turning now to FIG. 1, a prior art TO-package 10 is illustrated. Package 10 is commercially available and includes a base or header 12 with a can 14 mounted in a vertical position on the upper surface. A semiconductor laser (not visible) is mounted on header 12 within can 14 so as to direct generated light outwardly through the upper end of can 14. Generally, can 14 is sealed with a glass window in the upper end, which provides a convenient exit for the light generated by the semiconductor laser. Can 14 is sealed to header 12 and communication with the laser and any other internal components is provided through header 12.

Generally, leads 15 are provided so as to extend through header 12 and connect directly to the internal components. Leads 15 may be sealed in header 12 by means of some insulating material 17, such as glass beads or the like, which surrounds and holds leads 15 fixedly in openings or vias extending through header 12. Leads 15 are constructed of relatively heavy or thick conducting material, such as wire including copper, aluminum, etc. Leads 15 are constructed relatively thick to withstand the rigors of shipping, storing, assembly, and ultimate connection to external equipment. Also, when TO-package 15 is connected to external equipment, leads 15 are generally used to mount the entire package. Further, because of a wide variety of external connection methods and processes, leads 15 must be originally made relatively long. The excessive external length of leads 15 greatly increases manufacturing, shipping, storing, and usage problems.

Generally, leads 15 are connected to external equipment by means of through-holes or vias formed in a printed circuit board or flex lead. Leads 15 are then inserted in the through-holes and soldered to provide electrical and physical connection. During this assembly process the length of the leads can greatly complicate the assembly. Excess lead is then simply cut away.

Referring additionally to FIG. 2, one method of connecting leads 15 to external equipment is illustrated. In this method, a flex-lead 20 is provided with through-holes or vias positioned to receive leads 15 therethrough. Generally, the sides of vias in flex-lead 20 are coated with solder. Flex-lead 20 includes conductive traces 22 which communicate with the solder on the sides of the vias and extend along flex-lead 20 to the external equipment, etc. Flex-lead 20 is positioned with leads 15 extending through the vias and leads 15 are soldered in the vias so as to physically and electrically connect leads 15 to conductive traces 22. Portions of leads 15 extending beyond flex-lead 20 are then cropped to remove the excess material.

Here it will be noted that leads 15, even though cropped and relatively short will still reduce the speed of the assembly because of stray capacitance and inductance circuits formed by leads 15. Cropping the leads, while removing much of the excess leads 15, still leaves some excess, both inside and outside the vias in flex-lead 20. Further, because of tolerances in the assembly process, the amount of lead remaining can change from package to package so that the stray capacitance and inductance circuits change and, hence, the speed of the assembly changes. To compensate for this change, the final packages must be rated as low or lower than the worst case scenario.

Turning now to FIG. 3, an isometric view is illustrated of an improved TO-package 30 in accordance with the present invention. Improved package 30 includes a header 32 and a can 34 sealed on the upper surface of header 32. Mounted on the upper surface of header 32, within can 34 are any components to be contained within improved package 30. It will be understood that package 30 can be used as a high-speed receiver, but is illustrated as a transmitter for as discussed below.

Referring additionally to FIG. 4, a sectional view of improved package 30 is illustrated, showing some typical internal components and an approximate position of the components. In this example, a VCSEL 35 is mounted on the upper surface of header 32 so as to emit light out through a window 36, sealingly positioned in the upper end of can 34. In addition, window 36 is canted at a slight angle so as to reflect a small portion of the emitted light from VCSEL 35 back onto a photodiode 37. Photodiode 37 can be used in external circuitry to monitor the output of VCSEL 35, generally to maintain the output of VCSEL 35 constant. VCSEL 35 and photodiode 37 each include two terminals, one of which is connected in common, to provide three external connections.

Here several different methods of manufacture can be employed in accordance with the present invention. In an example of a first method, TO-package 30 is constructed as in the prior art (with leads 15 extending from header 12). Leads 15 are then cut as close to the lower surface of header 32 as can be achieved. The remainder of the leads still present at the lower surface of header 32 is then lapped or otherwise polished flat to leave only a metal terminal 38 (see FIG. 3) on the lower surface of header 32.

If commercially available TO-packages are not used, vias filled with solder or the like, designated 40 in FIG. 4, can be provided in header 32. The terminals of VCSEL 35 and photodiode 37 can than be bump soldered or otherwise attached to vias 40. This could be accomplished, for example, by a simple pick-and-place machine before can 34 is attached to header 32 or before window 36 is sealed in place. The lower ends of vias 40 are then formed into (or naturally form) metal terminals 38. In this method, no wire lead 15 is required at any stage of the process and assembly of TO-package 30 is greatly simplified.

Referring additionally to FIG. 5, a method and resulting apparatus are illustrated of mounting TO-package 30 onto a flex-lead 42 in accordance with the present invention. In this example, flex-lead 42 includes conductive traces 44 positioned to electrically engage metal terminals 38 on header 32. Metal terminals 38 can be physically and electrically connected to conductive traces 44 by means of spot-welding, soldering, bump soldering, or any other convenient process. Since metal terminals 38 simply contact conductive traces 44, no accurately positioned through-holes or the like need to be provided in flex-lead 42, which greatly simplifies the manufacture and assembly.

Here it should be noted that improved TO-package 30 is connected directly to, for example, flex-lead 42 with all intervening leads removed. Thus, the stray capacitive and conductive circuits are substantially reduced or no longer present. Further, the inherent changes in stray capacitive and conductive circuits due to assembly tolerances, is completely removed. Because improved TO-package 30 connects B directly to flex-lead 42, the speed or operating frequency of the assembly is substantially improved.

It can be seen from this disclosure that the mounting of improved TO-package 30 onto flex-lead 42 does not require extremely accurate vias and alignment of leads. Similarly, improved TO-package 30 can be mounted on a printed circuit board or similar structure with a greatly improved or relaxed tolerance. Further, the manufacture of improved TO-package 30 and any structure on which it is to be mounted is greatly simplified. Also, storage, shipping, handling during manufacturing and assembly, and other processes involving improved TO-package 30 are greatly improved.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. An optoelectronic package comprising:
   a header with a surface, an opposed surface, and at least one side;
   at least one via extending through the header from the surface to the opposed surface;
   a conductive interconnect positioned within the at least one via, the conductive interconnect extending from the surface to the opposed surface of the header wherein the conductive interconnect is substantially flush with the opposed surface of the header; and
   a TO cap with an end and an opposed end positioned on the header, the header including a window at the end and an opening at the opposed end.

2. An optoelectronic package as claimed in claim 1 wherein at least one light emitting device is positioned on the surface of the header, the at least one light emitting device being positioned to emit light out the window, and wherein at least one light detecting device is positioned proximate to the at least one light emitting device, wherein the window is canted at an angle relative to the surface of the header.

3. An optoelectronic package as claimed in claim 2 wherein the angle is chosen such that a portion of the light emitted by the at least one light emitting device is reflected off the window and incident to the light detecting device.

4. An optoelectronic package as claimed in claim 3 wherein the light detecting device monitors the output of the at least one light emitting device.

5. An optoelectronic package as claimed in claim 1 wherein the conductive interconnect includes at least one of solder, gold, silver, platinum, and another conductive material with suitable properties for electrical conduction.

6. An optoelectronic package as claimed in claim 5 wherein a conductive trace is positioned on the opposed side of the supporting structure, the conductive trace being in communication with the conductive interconnect.

7. An optoelectronic package as claimed in claim 1 wherein the conductive interconnect extends out from the opposed surface of the header by a distance in a range between approximately 0.01 millimeters to 5 millimeters.

8. A method of forming an optoelectronic package, the method comprising the steps of:
   providing a supporting structure with a surface, an opposed surface, and at least one side, wherein at least one via is formed through the supporting structure, the at least one via extending through the supporting structure from the surface to the opposed surface, the supporting structure further including a conductive interconnect positioned within the at least one via, the conductive interconnect extending from the surface to the opposed surface of the supporting structure wherein the conductive interconnect is substantially flush with the opposed surface of the supporting structure.

9. A method as claimed in claim 8 further including a step of positioning an enclosing structure on the surface of the supporting structure, the enclosing structure including an opening at an end and a window at an opposed end wherein the end of the enclosing structure is positioned adjacent to the surface of the supporting structure.

10. A method as claimed in claim 9 wherein the step of positioning the enclosing structure includes a step of providing the window at an angle relative to the surface of the supporting structure.

11. A method as claimed in claim 10 further including a step of providing a light emitting device mounted on the surface of the supporting structure wherein the light emitting device is in communication with the at least one conductive interconnect.

12. A method as claimed in claim 11 further including a step of providing a photodiode positioned on the surface of the supporting structure wherein the photodiode is positioned to detect light emitted by the light emitting device and reflected off the window.

13. A method as claimed in claim 8 further including a step of providing at least one conductive trace positioned on the opposed surface of the supporting structure, the at least one conductive trace being in communication with the at least one conductive interconnect.

14. A method as claimed in claim 13 further including a step of providing at least one flex lead in communication with the at least one conductive trace.

15. A method as claimed in claim 8 wherein the step of making the conductive interconnect substantially flush with the opposed surface of the supporting structure includes a step of extending the conductive interconnect out from the opposed surface of the supporting structure by a distance in a range between approximately 0.01 millimeters to 5 millimeters.

* * * * *